(12) United States Patent
Van Sprang et al.

(10) Patent No.: US 8,410,504 B2
(45) Date of Patent: Apr. 2, 2013

(54) LED MODULE

(75) Inventors: Hendrik Adrianus Van Sprang, Eindhoven (NL); Hendrik Johannes Boudewijn Jagt, Eindhoven (NL); Berno Hunsche, Aachen (DE); Thomas Diederich, Stolberg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 12/994,867

(22) PCT Filed: May 29, 2009

(86) PCT No.: PCT/IB2009/052264
§ 371 (c)(1),
(2), (4) Date: Nov. 29, 2010

(87) PCT Pub. No.: WO2009/150561
PCT Pub. Date: Dec. 17, 2009

(65) Prior Publication Data
US 2011/0073898 A1 Mar. 31, 2011

(30) Foreign Application Priority Data

Jun. 10, 2008 (EP) .................................. 08157943

(51) Int. Cl.
*H01L 33/00* (2010.01)
(52) U.S. Cl. ........... 257/98; 257/E33.061; 257/E33.072; 313/112; 362/293; 438/26

(58) Field of Classification Search ................ 257/98, 257/E33.061, E33.067, E33.072; 438/33, 438/34, 26; 362/293; 313/112, 113
See application file for complete search history.

(56) References Cited

U.S. PATENT DOCUMENTS

| 5,813,753 | A  | * | 9/1998 | Vriens et al. ................. 362/293 |
| 5,882,774 | A  | * | 3/1999 | Jonza et al. .................. 428/212 |
| 6,531,230 | B1 | * | 3/2003 | Weber et al. ................. 428/480 |
| 6,565,770 | B1 |   | 5/2003 | Mayer et al. |
| 6,570,302 | B1 |   | 5/2003 | Boonekamp et al. |
| 7,193,225 | B2 |   | 3/2007 | Maezawa et al. |
| 7,210,977 | B2 | * | 5/2007 | Ouderkirk et al. ............. 445/24 |
| 7,245,072 | B2 |   | 7/2007 | Ouderkirk et al. |
| 2002/0057059 | A1 | * | 5/2002 | Ogishi et al. ................. 313/636 |
| 2002/0068373 | A1 | * | 6/2002 | Lo et al. ....................... 438/33 |
| 2003/0001657 | A1 | * | 1/2003 | Worley et al. ................ 327/514 |

(Continued)

FOREIGN PATENT DOCUMENTS

| EP | 1187226 A1 | 3/2002 |
| EP | 1403934 A2 | 3/2004 |

(Continued)

*Primary Examiner* — William F Kraig
(74) *Attorney, Agent, or Firm* — Mark L. Beloborodov

(57) ABSTRACT

The present invention relates to a LED module which converts pump light from a LED chip (120) to light at another wavelength, which is emitted from the module. The conversion takes place in a portion of a luminescent material (124). The color purity of the LED module is enhanced by reducing any leakage of pump light using a reflector in combination with an absorber. In one embodiment, the absorber is integrated as one or several thin absorbing layers between the layers of a multi-layer reflection filter (126); this may yield an even higher reduction of pump light leakage from the module.

9 Claims, 6 Drawing Sheets

U.S. PATENT DOCUMENTS

| | | | |
|---|---|---|---|
| 2003/0123155 A1* | 7/2003 | Quake et al. | 359/664 |
| 2004/0211927 A1* | 10/2004 | Schmidt | 250/504 R |
| 2006/0152155 A1 | 7/2006 | Henninger et al. | |
| 2007/0023762 A1 | 2/2007 | Gumins et al. | |
| 2007/0120135 A1* | 5/2007 | Soules et al. | 257/98 |
| 2007/0231502 A1* | 10/2007 | Jones et al. | 427/532 |
| 2010/0182678 A1* | 7/2010 | Southwell | 359/359 |

FOREIGN PATENT DOCUMENTS

| | | |
|---|---|---|
| EP | 1482533 A2 | 12/2004 |
| EP | 1196719 A2 | 4/2008 |
| EP | 1916719 A2 * | 4/2008 |
| GB | 2215075 A | 9/1999 |
| WO | 2007039849 A1 | 4/2007 |

* cited by examiner

LED MODULE

FIELD OF THE INVENTION

The present invention relates to a lightsource, comprising a LED chip adapted for emitting excitation light in a first wavelength range; a wavelength converter adapted for converting excitation light to converted light in a second wavelength range; and a reflector, adapted for transmitting converted light, and for reflecting excitation light onto the wavelength converter.

BACKGROUND OF THE INVENTION

U.S. Pat. No. 7,245,072 B2 discloses a LED module comprising a LED, a layer of a phosphor material, and a birefringent polymeric multi-layer reflection filter. The phosphor material, which is located between the reflection filter and the LED, emits visible light when illuminated with ultraviolet (UV) excitation light by the LED, and the filter serves for removing remaining, unconverted UV light from the optical output of the LED module. By using birefringent polymers in the reflector layer, better filtering of UV light having an oblique angle of incidence onto the filter is reported.

The use of multiple birefringent layers in the reflector however leads to complicated devices and/or fabrication methods.

SUMMARY OF THE INVENTION

It is an object of the present invention to provide a less complicated technique for removing excitation light from the light output of a LED module. To this end, there is provided a lightsource, comprising a LED chip adapted for emitting excitation light in a first wavelength range; a wavelength converter adapted for converting excitation light to converted light in a second wavelength range; a reflector, adapted for transmitting converted light, and for reflecting excitation light onto the wavelength converter; and an absorption layer, arranged for absorbing unconverted excitation light. The absorption layer assists in decreasing the amount of emitted excitation light.

Preferably, the reflector is a multi-layer reflector comprising a plurality of alternating layers of at least two different materials having at least two different indices of refraction. Such reflectors may be given a high wavelength selectivity at a substantially normal angle of incidence of the light.

Preferably, the absorption layer is located between layers of the reflector. This configuration may even further reduce the amount of transmitted excitation light impinging on the reflector at an angle of incidence that deviates from the reflection filter's surface normal, and/or reduce the required number of process steps in the fabrication of an efficient filter. More preferably, at least one fourth of the total number of reflector layers is located on each side of the absorber.

Preferably, the wavelength converter is located between the reflector and the LED chip, as this configuration is beneficial from a conversion efficiency point of view. Preferably, the reflector, the absorption layer, the wavelength converter and the LED chip are joined to form a single device. This is a very compact and efficient configuration that is inexpensive to fabricate.

Preferably, the multi-layer reflector and the absorber have a total thickness of less than 2000 nm.

BRIEF DESCRIPTION OF THE DRAWINGS

This and other aspects of the present invention will now be described in more detail, with reference to the appended drawings showing a currently preferred embodiment of the invention.

DETAILED DESCRIPTION

Light emitting diodes, LEDs, are used for a wide variety of applications. Often, a luminescent converter is integrated into the LED module to create light of a different color than the light originally emitted from the LED.

In order to obtain a pure color of the light emitted from a LED module using luminescent conversion, it is important that no excitation light be allowed to exit from the LED module. This is particularly important in applications where the required color temperature is specified by standards and regulations. To this end, a filter is sometimes disposed in the LED module in order to filter away any remaining excitation light from the LED module output.

Figure 1:
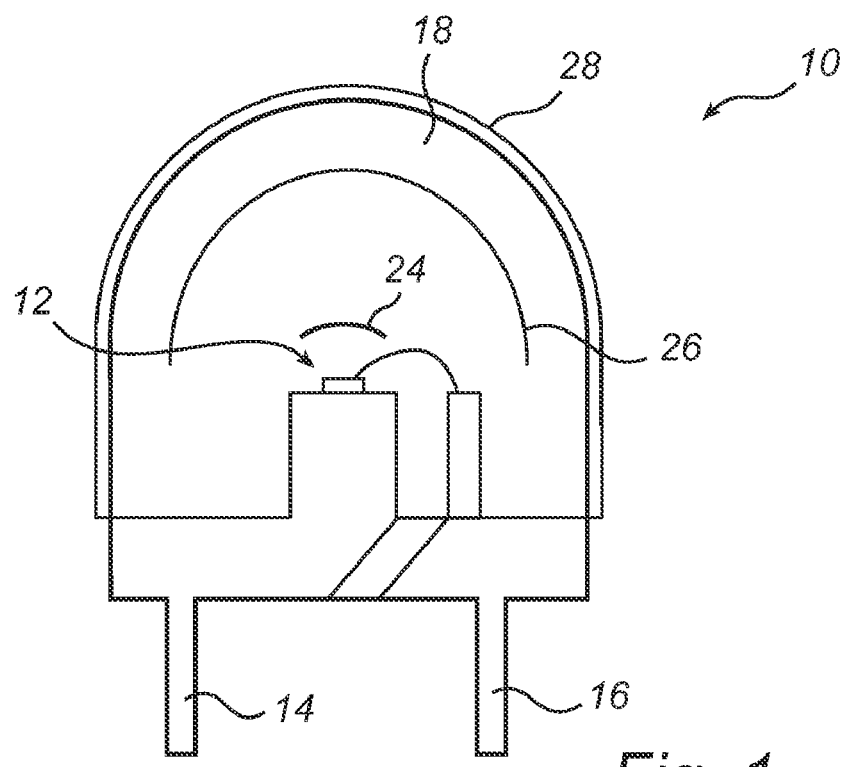
FIG. 1 is a schematic sectional view of a LED module comprising a LED chip, a luminescent converter, a reflector and an absorber.

FIG. 1 schematically illustrates an exemplary embodiment of a LED module 10 comprising a LED 12. The LED 12 is fed with electrical current via terminals 14, 16, and the output light of the LED 12 is coupled out of the LED module 10 via an essentially hemispherical lens 18. The LED is arranged to emit ultraviolet (UV) light, and a phosphor layer 24 converts the UV light to white light, i.e. to a mixture of red, green, and blue light. Total conversion of the UV light is not achieved as the phosphor layer would then have to be too thick, leading to a high re-absorption of red, green, and blue light. Therefore, in order to reduce the emission of UV light from the module 10, the lens 18 comprises a reflector 26, which reflects UV light and transmits visible light. A wavelength selective absorption layer 28 on the surface of the lens significantly reduces any leakage of UV light. The wavelength selectivity of the absorption layer 28 is such that its absorption is higher in the UV wavelength range than in the visible wavelength range. Throughout this disclosure, an absorption layer is defined as a layer consisting of material(s) having an extinction coefficient k>0.005 in the excitation wavelength range. An absorption layer is intended to be located in the light path from the light emitting surface of the LED chip and/or the luminescent converter, to the LED module light output surface; structures such as electrical wiring, opaque LED chip submounts or the like are not considered absorber layers in this sense.

Figure 2:
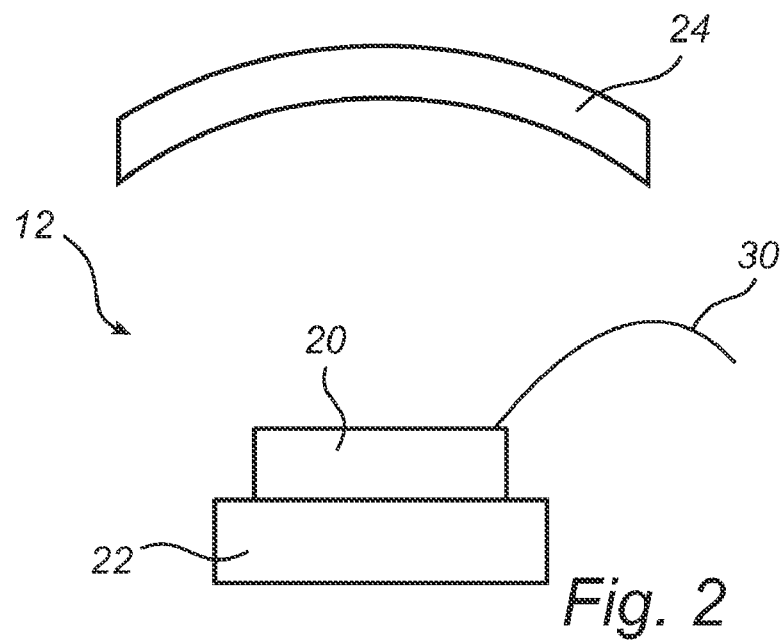
FIG. 2 is a schematic sectional view of the LED and the luminescent converter in FIG. 1.

FIG. 2 shows the LED 12 and the phosphor layer 24 of FIG. 1 more in detail. A LED chip 20 is located on a submount 22. Electrical current is fed to the top electrode of the LED chip 20 through a wire 30.

Figure 3:
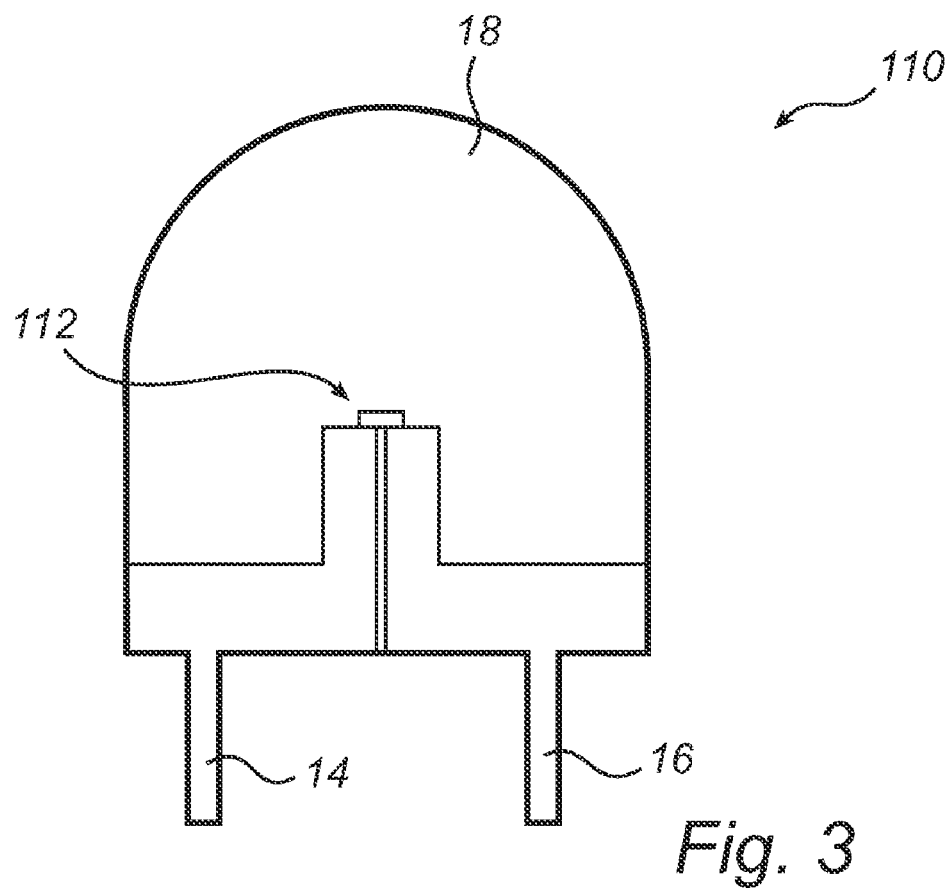
FIG. 3 is a schematic sectional view of a LED module having the luminescent converter, reflector, and absorber integrated with the LED chip.

FIG. 3 schematically illustrates an exemplary embodiment of a LED module 110 comprising a LED 112.

Figure 4:
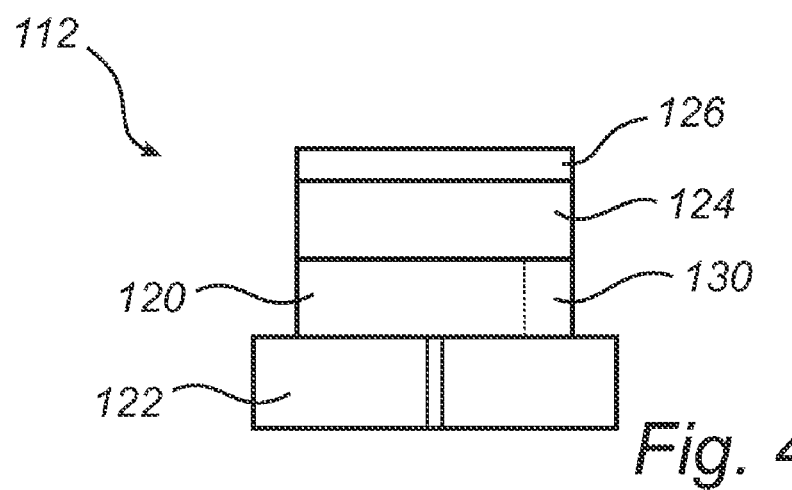
FIG. 4 is a schematic sectional view of the LED in FIG. 3.

FIG. 4 shows the LED 112 of FIG. 3 more in detail. A LED chip 120 is flip-chip mounted onto a submount 122. Electrical current is fed to the top electrode of the LED chip 120 through a conductor 130 in a via-hole. The LED chip 120 emits blue excitation light in the wavelength range 400-470 nm, with a peak wavelength of about 450 nm. The excitation light is converted to amber light at about 600 nm by a luminescent phosphor material layer 124 attached to or deposited on the LED chip 120; in this particular example, the phosphor material is a LUMIRAMIC® comprising $(BaSr)_2Si_5N_8$:Eu, i.e. Barium Strontium Silicon Nitride doped with Europium. Its emission wavelength characteristic may be varied by changing the ratio between Barium and Strontium; in this case, 85% Ba and 15% Sr is used. On top of the LUMIRAMIC® layer 124, there is a multi-layer reflector coating 126, which incorporates an absorbing layer. Locating the reflector directly on the LUMIRAMIC® layer has the advantage of reflecting back a larger portion of the unconverted excitation light onto the LUMIRAMIC® layer, and thus increasing the conversion efficiency.

A multi-layer reflector is a type of interference filter that consists of several alternating layers having different indices of refraction; their wavelength response can be designed relatively freely, and they can be designed to give a high suppression of the excitation light. Multi-layer reflectors are therefore very well suited for removing excitation light from the LED module output.

However, as the transparency of a typical interference filter coating varies with the angle of incidence of the light impinging on the interference filter coating, some excitation light will leak through the filter due to the fact that LEDs and wavelength converters typically do not produce a collimated output.

Figure 5:
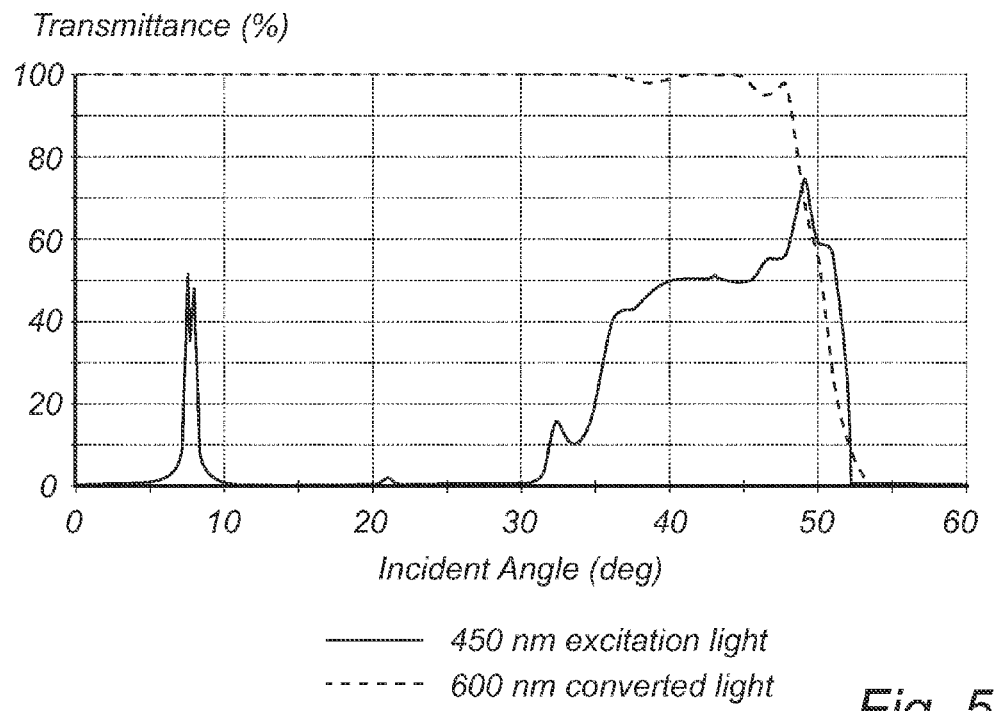
FIG. 5 is a graph, illustrating the transmittance of a multi-layer reflector.

Table 1 gives an example of the structure of a multi-layer reflector that is not provided with an internal absorber layer; its corresponding transmittance as a function of angle of incidence, relative to the reflector surface normal, is given in FIG. 5. The filter is made up of alternating layers of $SiO_2$, having a refractive index of approx. 1.46, and $Nb_2O_5$, with a refractive index of approx. 2.39. Layer no. 1 is adjacent to a LUMIRAMIC®

TABLE 1

| Layer | Material | d (nm) |
| --- | --- | --- |
| 1 | $Nb_2O_5$ | 22.43 |
| 2 | $SiO_2$ | 47.46 |
| 3 | $Nb_2O_5$ | 58.51 |
| 4 | $SiO_2$ | 37.19 |
| 5 | $Nb_2O_5$ | 56.08 |
| 6 | $SiO_2$ | 58.00 |
| 7 | $Nb_2O_5$ | 167.17 |
| 8 | $SiO_2$ | 61.99 |

TABLE 1-continued

| Layer | Material | d (nm) |
| --- | --- | --- |
| 9 | $Nb_2O_5$ | 163.83 |
| 10 | $SiO_2$ | 62.79 |
| 11 | $Nb_2O_5$ | 164.02 |
| 12 | $SiO_2$ | 86.66 |
| 13 | $Nb_2O_5$ | 31.59 |
| 14 | $SiO_2$ | 86.17 |
| 15 | $Nb_2O_5$ | 38.59 |
| 16 | $SiO_2$ | 78.94 |
| 17 | $Nb_2O_5$ | 56.06 |
| 18 | $SiO_2$ | 32.39 |
| 19 | $Nb_2O_5$ | 81.56 |
| 20 | $SiO_2$ | 39.43 |
| 21 | $Nb_2O_5$ | 179.54 |
| 22 | $SiO_2$ | 55.61 |
| 23 | $Nb_2O_5$ | 164.17 |
| 24 | $SiO_2$ | 67.07 |
| 25 | $Nb_2O_5$ | 162.12 |
| 26 | $SiO_2$ | 60.98 |
| 27 | $Nb_2O_5$ | 74.36 |
| 28 | $SiO_2$ | 21.77 |
| 29 | $Nb_2O_5$ | 63.28 |
| 30 | $SiO_2$ | 52.35 |
| 31 | $Nb_2O_5$ | 295.69 |
| 32 | $SiO_2$ | 51.12 |
| 33 | $Nb_2O_5$ | 159.13 |
| 34 | $SiO_2$ | 71.99 |
| 35 | $Nb_2O_5$ | 154.03 |
| 36 | $SiO_2$ | 72.77 |
| 37 | $Nb_2O_5$ | 153.48 |
| 38 | $SiO_2$ | 63.71 |
| 39 | $Nb_2O_5$ | 146.28 |
| 40 | $SiO_2$ | 77.15 |
| 41 | $Nb_2O_5$ | 5.71 |
| Total Thickness | | 3583.18 | converter, and layer no. 41 is adjacent to a lens having a refractive index of about 1.5; d signifies the thickness of each layer in nanometers.

Table 2 gives an example of the structure of the multi-layer reflector 126 of the LED module described above with reference to FIGS. 2-3, wherein the filter incorporates an integrated absorber layer of $Fe_2O_3$. The filter's transmittance as a function of angle of incidence is given in FIG. 6. Layer no. 1 is adjacent to the LUMIRAMIC® converter 124 and layer no. 17 is adjacent to the lens 18, which consists of $SiO_2$. Note that the thickness of the reflection filter is approximately one third of the thickness of the reflection filter of table 1. Also, the absorber layer is an integral part of the reflector and contributes to the reflective properties of the device, since $Fe_2O_3$ has an index of refraction of 3.11, significantly different from the index of refraction of the adjacent $Nb_2O_5$ layers. The reflection filter multilayer structure surrounding the thin absorbing $Fe_2O_3$ layer, on the other hand, enhances the absorption of the thin $Fe_2O_3$ layer.

TABLE 2

| Layer | Material | d (nm) |
| --- | --- | --- |
| 1 | $Nb_2O_5$ | 149.61 |
| 2 | $SiO_2$ | 46.59 |
| 3 | $Nb_2O_5$ | 162.56 |
| 4 | $SiO_2$ | 59.38 |
| 5 | $Nb_2O_5$ | 160.02 |
| 6 | $SiO_2$ | 62.68 |
| 7 | $Nb_2O_5$ | 78.00 |
| 8 | $Fe_2O_3$ | 8.40 |
| 9 | $Nb_2O_5$ | 80.66 |
| 10 | $SiO_2$ | 64.37 |
| 11 | $Nb_2O_5$ | 46.08 |
| 12 | $SiO_2$ | 72.79 |

TABLE 2-continued

| Layer | Material | d (nm) |
|---|---|---|
| 13 | $Nb_2O_5$ | 31.75 |
| 14 | $SiO_2$ | 95.16 |
| 15 | $Nb_2O_5$ | 44.42 |
| 16 | $SiO_2$ | 53.56 |
| 17 | $Nb_2O_5$ | 31.17 |
| Total Thickness | | 1247.19 |

Figure 6:
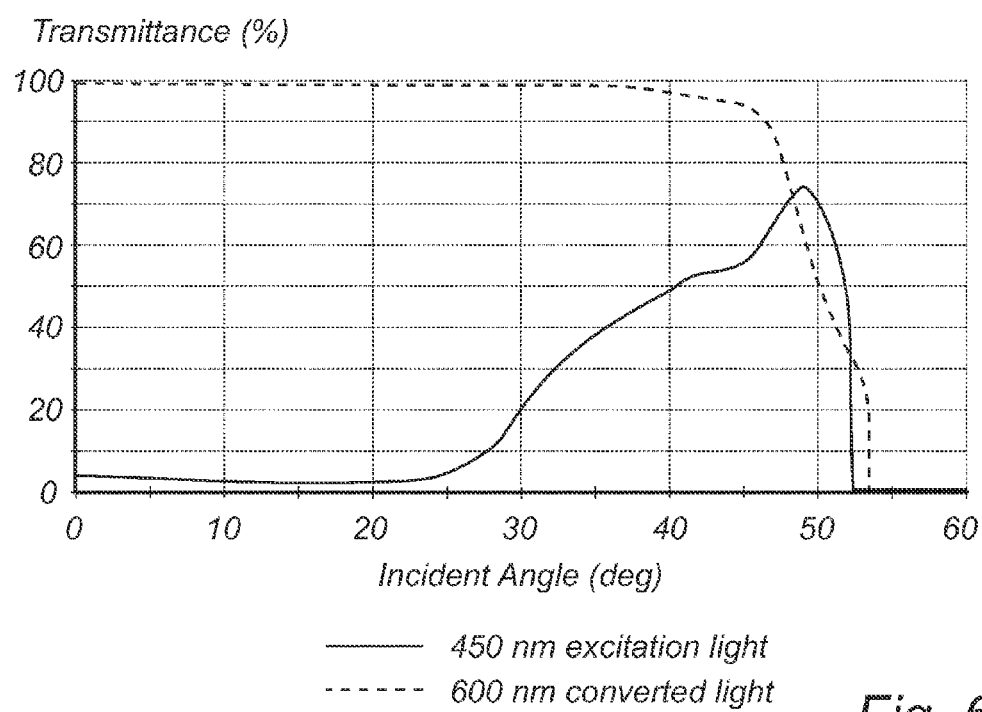
FIG. 6 is a graph, illustrating the transmittance of a multi-layer reflector comprising an absorber layer.

The significant difference between the angular dependencies of the two filters of the graphs in FIGS. 5-6 is impressive. By integrating only a thin layer of an absorber into the filter, the filter can not only be made thinner and fabricated using fewer process steps; also the angular dependency of the transmittance of blue light is significantly reduced, and higher-order transmission spikes at low angles are removed.

Figure 7:
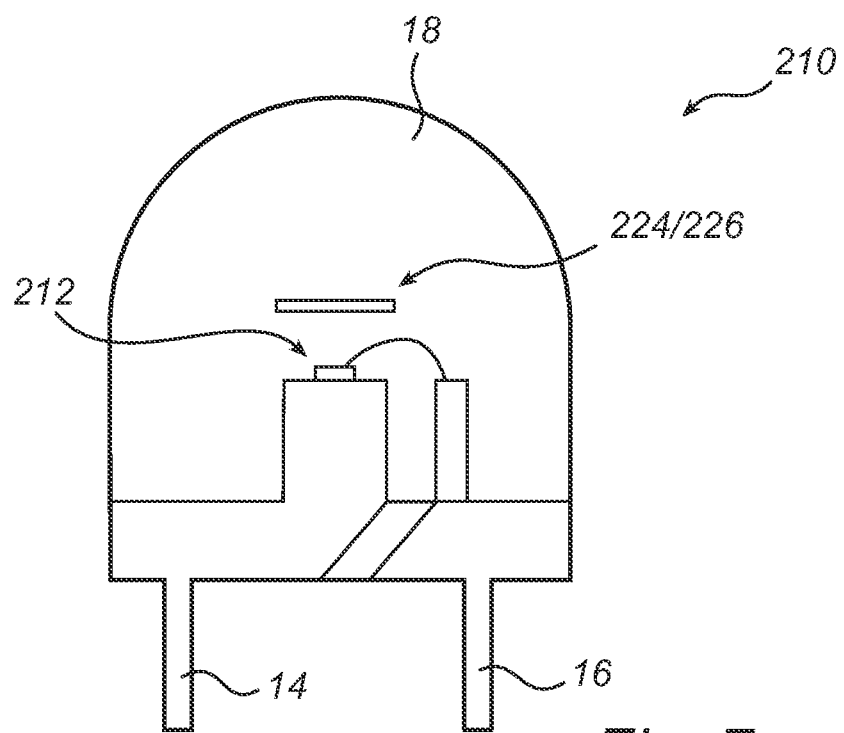
FIG. 7 is a schematic sectional view of a LED module, showing an alternative geometric configuration of the luminescent converter and the reflector.
Figure 8:
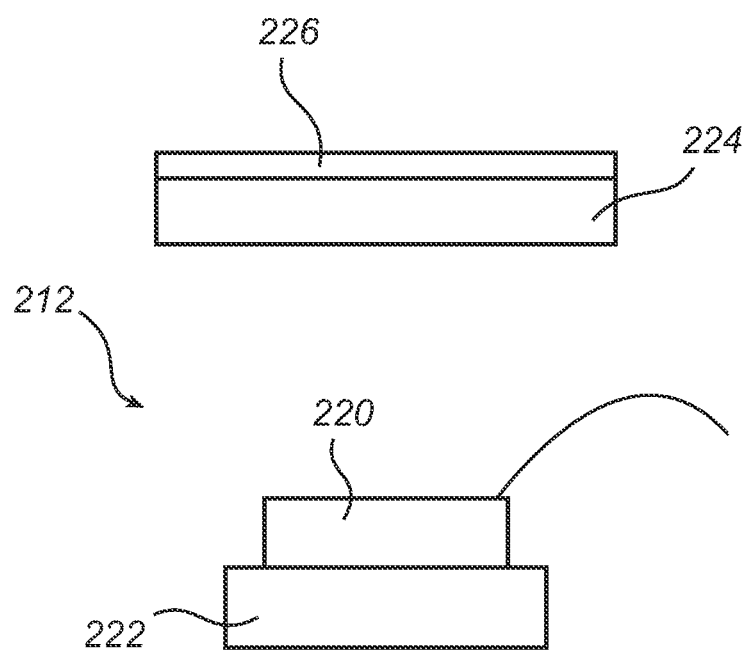
FIG. 8 is a schematic sectional view of the LED, the luminescent converter, and the reflector in FIG. 7.

FIG. 7 schematically illustrates an exemplary embodiment of a LED module 210 comprising a LED 212 and a separate phosphor/reflector/absorber portion 224/226. The configuration of the LED 212 and the phosphor/reflector/absorber portion is illustrated more in detail in FIG. 8, which shows a multi-layer reflector 226, comprising a plurality of transparent, alternating reflector layers and a plurality of integrated absorber layers deposited onto a layer of phosphor 224.

Figure 9:
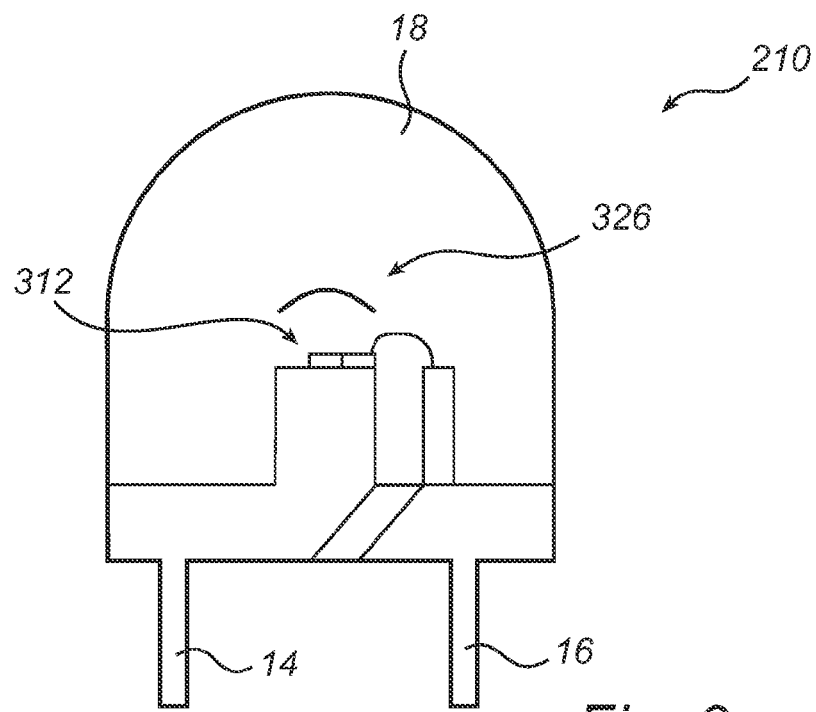
FIG. 9 is a schematic sectional view of a LED module, showing yet another alternative geometric configuration of the luminescent converter and the reflector.
Figure 10:
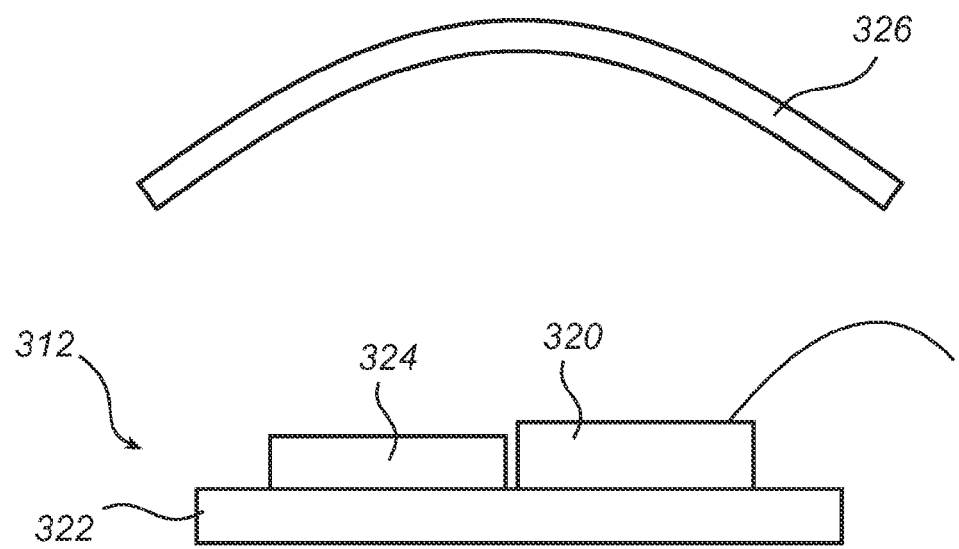
FIG. 10 is a schematic sectional view of the LED and the reflector in FIG. 9.

FIGS. 9 and 10 illustrate an alternative geometry of the LED module, wherein the LED chip 320 and the luminescent converter 324 are mounted side by side on a submount 322. Excitation light from the LED chip is reflected onto the luminescent converter 324 by an essentially parabolic multi-layer reflector 326, which also incorporates an absorber layer. The reflector 326 is arranged to transmit the converted light from the luminescent converter, and the absorption layer reduces the reflector's 326 transmission of any excitation light impinging on the reflector 326 at substantially oblique angles.

The geometric separation of the LED chip 320 and the luminescent converter 324 also makes it possible to locate and extend a separate hemispherical absorber (not shown) around the luminescent converter, such that converted light from the luminescent converter will pass through the separate absorber at a normal angle of incidence, and excitation light leaking through the reflector will pass through the separate absorber at an oblique angle. This will make the path through the absorber longer for the excitation light than for the converted light.

Figure 11:
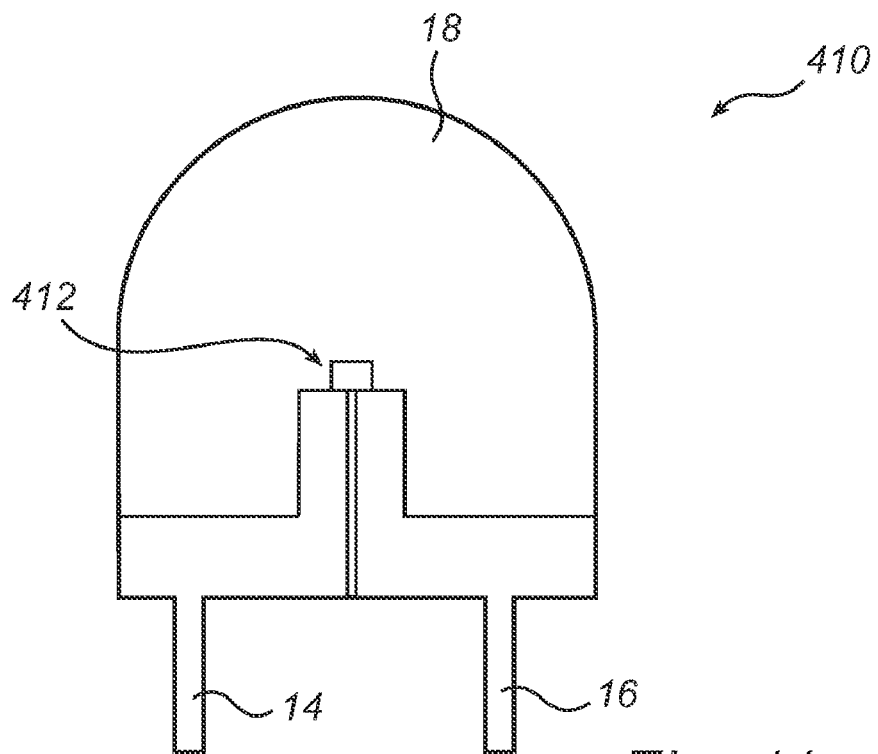
FIG. 11 is a schematic sectional view of a LED module, showing still another alternative geometric configuration of the luminescent converter and the reflector.
Figure 12:
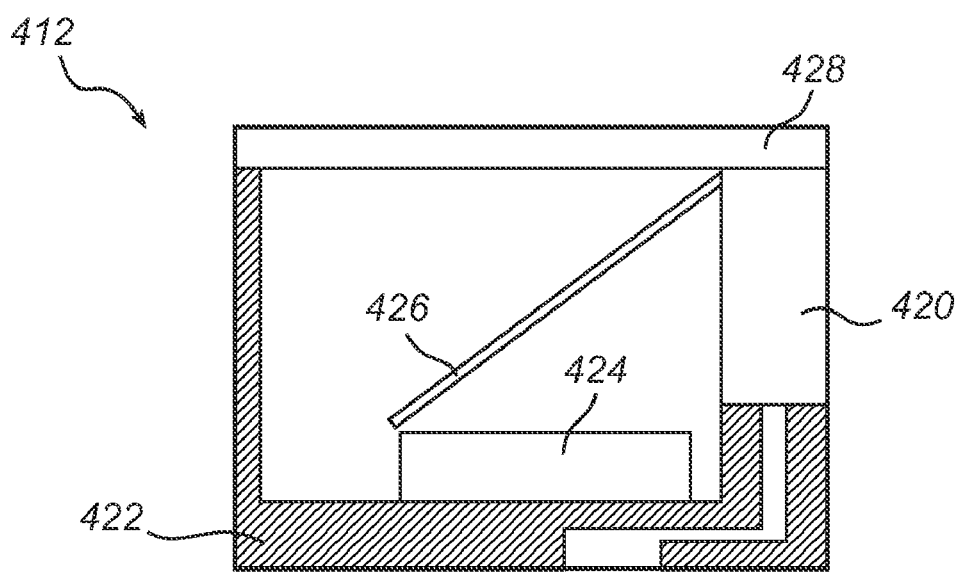
FIG. 12 is a schematic sectional view of the LED and the reflector in FIG. 11.

FIGS. 11 and 12 show an embodiment illustrating how a geometric separation of the LED chip from the luminescent converter may enable different absorption levels of excitation light and converted light, respectively, and thereby contribute to improving the colour temperature of a LED module. A wavelength selective reflector 426 reflects the light from a LED chip 420 onto a luminescent converter 424. Converted light from the luminescent converter passes through the reflector, and then through an absorber 428 at a normal angle of incidence. Any excitation light from the LED chip 420 that may leak through the wavelength selective reflector 426 will pass through the absorber 428 at an oblique angle. This will make the path through the absorber 428 longer for the excitation light than for the converted light.

In summary, the invention relates to a LED module which converts pump light from a LED chip to light at another wavelength, which is emitted from the module. The conversion takes place in a portion of a luminescent material. The color purity of the LED module is enhanced by reducing any leakage of pump light using a reflector in combination with an absorber. In one embodiment, the absorber is integrated as one or several thin absorbing layers between the layers of a multi-layer interference filter; this may yield an even higher reduction of pump light leakage from the module.

The person skilled in the art realizes that the present invention by no means is limited to the preferred embodiments described above. On the contrary, many modifications and variations are possible within the scope of the appended claims. For example, the invention is not limited to absorption layers of $Fe_2O_3$; also other materials featuring an absorption in the excitation wavelength range may be used, for example but not limited to zinc iron oxide, titanium iron oxide, vanadium oxide, bismuth oxide, copper oxide, bismuth vanadate, zirconium praseodymium silicate, or any mixture thereof.

Neither is the invention limited to luminescent layers of LUMIRAMIC® or other phosphorescent materials; any atomic or molecular species or solid-state compounds that convert at least a part of incident electromagnetic radiation to electromagnetic radiation with a characteristic signature may be used, such as fluorescent dyes or luminescent quantum dots.

In the examples above, the multi-layer reflectors comprise alternating layers of $Nb_2O_5$ and $SiO_2$. Other combinations of two or more different materials, having different indices of refraction, may be used and are covered by the appended claims. Further, the reflector is not limited to multi-layer reflectors; any type of wavelength selective reflector capable of reflecting the excitation wavelength while at the same time transmitting the converted wavelength may be used. The absorber may consist of one or several absorbing layers integrated in the reflector, or it may be a separate absorber located elsewhere in the LED module. Even though the entire LED module preferably is comprised in a single housing, it may also be divided between separate housings. Different parts of the device may be separated between different modules, which, when cooperating, obtain the same function as claimed. Further, even though in the examples above, blue or UV light is used to generate amber or white light, other combinations are also covered by the appended claims. The invention is not limited to LED chips or luminescent converters emitting visible light; they may as well emit in the IR and UV regions. Nor is the invention limited to LED:s emitting excitation light in a broadband optical spectrum. Also narrow-band LED:s incorporating any type of optical feed-back and stimulated emission, such as diode lasers, are within the scope of the claim. Features disclosed in separate embodiments in the description above may be advantageously combined.

The use of the indefinite article "a" or "an" in this disclosure does not exclude a plurality. Any reference signs in the claims should not be construed as limiting the scope.

The invention claimed is:

1. A light source, comprising:
    a light emitting diode (LED) chip and a luminescent wavelength converter mounted side by side on a sub-mount, the LED chip emitting excitation light in a first wavelength range, the wavelength converter converting excitation light to converted light in a second wavelength range;
    a parabolic multi-layer reflector incorporating an absorption layer, the parabolic multi-layer reflector transmitting converted light from the luminescent wavelength converter, the incorporated absorption layer reducing the parabolic multi-layer reflector's transmission of any excitation light impinging on the parabolic multi-layer reflector at substantially oblique angles; and a separate hemispherical absorber positioned around the luminescent wavelength converter so that converted light from the luminescent wavelength converter passes through the separate hemispherical absorber at a normal angle of incidence and excitation light leaking through the parabolic multi-layer reflector passes through the separate hemispherical absorber at an oblique angle.

2. The lightsource of claim 1 wherein the parabolic multi-layer reflector comprises a plurality of alternating layers of at least two different materials having at least two different indices of refraction.

3. The lightsource of claim 1 further comprising a lens enclosing the LED chip, the luminescent wavelength converter and the parabolic multi-layer reflector incorporating the absorption layer.

4. The lightsource of claim 3 wherein the lens is hemispherical.

5. A light-emitting diode (LED) module comprising:

a light emitting diode (LED) chip and a luminescent wavelength converter mounted side by side on a sub-mount;

a pair of electrical terminals providing electrical current to the LED chip;

a parabolic multi-layer reflector incorporating an absorption layer;

a lens enclosing the LED chip, the luminescent wavelength converter mounted side by side on the sub-mount and the parabolic multi-layer reflector incorporating the absorption layer; and a separate hemispherical absorber positioned around the luminescent wavelength converter so that converted light from the luminescent wavelength converter passes through the separate hemispherical absorber at a normal angle of incidence and excitation light leaking through the parabolic multi-layer reflector passes through the separate hemispherical absorber at an oblique angle.

6. The LED module of claim 5 wherein the LED chip emits excitation light in a first wavelength range.

7. The LED module of claim 5 wherein the wavelength converter converts excitation light to converted light in a second wavelength range.

8. The LED module of claim 5 wherein the parabolic multi-layer reflector comprises a plurality of alternating layers of at least two different materials having at least two different indices of refraction.

9. The LED module of claim 5 wherein the incorporated absorption layer reduces the parabolic multi-layer reflector's transmission of any excitation light impinging on the parabolic multi-layer reflector at substantially oblique angles.

* * * * *